(12) United States Patent
Briere et al.

(10) Patent No.: US 9,564,498 B2
(45) Date of Patent: Feb. 7, 2017

(54) TRANSISTOR WITH ELEVATED DRAIN TERMINATION

(71) Applicant: Infineon Technologies Americas Corp., El Segundo, CA (US)

(72) Inventors: Michael A. Briere, Scottsdale, AZ (US); Reenu Garg, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/750,262

(22) Filed: Jun. 25, 2015

(65) Prior Publication Data

US 2015/0295054 A1    Oct. 15, 2015

Related U.S. Application Data

(60) Division of application No. 13/941,335, filed on Jul. 12, 2013, now Pat. No. 9,070,755, which is a continuation-in-part of application No. 13/749,477, filed on Jan. 24, 2013, now Pat. No. 9,379,231.

(60) Provisional application No. 61/674,553, filed on Jul. 23, 2012, provisional application No. 61/600,469, filed on Feb. 17, 2012.

(51) Int. Cl.
| | |
|---|---|
| *H01L 29/778* | (2006.01) |
| *H01L 29/417* | (2006.01) |
| *H01L 29/423* | (2006.01) |
| *H01L 29/40* | (2006.01) |
| *H01L 29/78* | (2006.01) |
| *H01L 29/20* | (2006.01) |

(52) U.S. Cl.
CPC ......... *H01L 29/41758* (2013.01); *H01L 29/20* (2013.01); *H01L 29/402* (2013.01); *H01L 29/42316* (2013.01); *H01L 29/778* (2013.01); *H01L 29/2003* (2013.01); *H01L 29/7787* (2013.01); *H01L 29/78* (2013.01)

(58) Field of Classification Search
CPC ............. H01L 29/778; H01L 29/42316; H01L 29/402; H01L 29/20
USPC ........................................................ 257/192
See application file for complete search history.

(56) References Cited

U.S. PATENT DOCUMENTS

| | | | | |
|---|---|---|---|---|
| 5,523,599 A | * | 6/1996 | Fujishima | ........... H01L 29/0615 257/327 |
| 2004/0178443 A1 | * | 9/2004 | Hossain | .............. H01L 29/7835 257/328 |
| 2006/0071304 A1 | * | 4/2006 | Jagannathan | ........... H01L 29/78 257/659 |

* cited by examiner

*Primary Examiner* — Douglas Menz
(74) *Attorney, Agent, or Firm* — Murphy, Bilak & Homiller, PLLC

(57) ABSTRACT

According to an exemplary implementation, a transistor includes drain finger electrodes interdigitated with source finger electrodes. The transistor also includes a current conduction path in a semiconductor substrate between the drain finger electrodes and the source finger electrodes. At least one of the drain finger electrodes has a drain finger electrode end and a drain finger electrode main body, where the drain finger electrode main body is non-coplaner with at least a portion of the drain finger electrode end. The transistor may also include a dielectric material situated between at least a portion of the drain finger electrode end and the semiconductor substrate. The dielectric material can be an increasing thickness dielectric material. The dielectric material can thus elevate the drain finger electrode end over the semiconductor substrate. Further, the drain finger electrode end can have an increased radius of curvature.

11 Claims, 6 Drawing Sheets

TRANSISTOR WITH ELEVATED DRAIN TERMINATION

This is a divisional of application Ser. No. 13/941,335 filed Jul. 12, 2013, which itself claims priority to U.S. provisional application Ser. No. 61/674,553, filed Jul. 23, 2012, and is a continuation in part of application Ser. No. 13/749,477, filed Jan. 24, 2013, which itself claims priority to U.S. provisional application Ser. No. 61/600,469, filed Feb. 17, 2012. The disclosures in the above-referenced patent applications are hereby incorporated fully by reference into the present application.

The present application claims the benefit of and priority to U.S. Provisional Patent Application Ser. No. 61/674,553, filed on Jul. 23, 2012 and entitled "Elevated Drain Finger Termination," and is a continuation-in-part of U.S. patent application Ser. No. 13/749,477, filed on Jan. 24, 2013 and entitled "Transistor Having Increased Breakdown Voltage," which itself claims the benefit of and priority to U.S. Provisional Patent Application Ser. No. 61/600,469, filed on Feb. 17, 2012 and entitled "Drain Termination for Transistor with Improved Breakdown Voltage." The disclosures of the above applications are hereby incorporated fully by reference into the present application.

STATEMENT OF GOVERNMENT INTEREST

This invention was made with Government support under Contract No. DE-AR0000016 awarded by Advanced Research Projects Agency-Energy (ARPA-E). The Government has certain rights in this invention.

BACKGROUND

I. Definitions

As used herein, the phrase "group III-V" refers to a compound semiconductor including at least one group III element and at least one group V element. By way of example, a group III-V semiconductor may take the form of a III-Nitride semiconductor. "III-Nitride", or "III-N", refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium. A group III-V or a GaN transistor may also refer to a composite high voltage enhancement mode transistor that is formed by connecting the group III-V or the GaN transistor in cascode with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

II. Background Art

Group III-V heterostructure field-effect transistors (group III-V HFETs), such as group III-V high electron mobility transistors (group III-V HEMTs), are often utilized in high power switching applications. For example, III-Nitride HEMTs may be utilized to provide switching and/or amplification functions.

Group III-V HFETs advantageously allow for power transistors using a lateral conduction topology in which drain, source, and gate electrodes are formed on one side of a semiconductor wafer or die. In a typical lateral transistor layout, for example, drain and source finger electrodes coupled to respective drain and source pads may be interdigitated with a gate region located between the source and drain. As the power requirement for such transistors continues to increase, the transistors are fabricated with a higher unit cell density. However, due to high termination electric fields typically present at the drain finger electrode ends, the gate-to-drain spacing at the drain finger electrode ends of higher density power transistors may be insufficient to reliably sustain a high breakdown voltage.

SUMMARY

A transistor having elevated drain finger termination such that at least a portion thereof is non-coplanar with the drain finger electrode main body, substantially as shown in and/or described in connection with at least one of the figures, and as set forth more completely in the claims.

DETAILED DESCRIPTION

Figure 1:
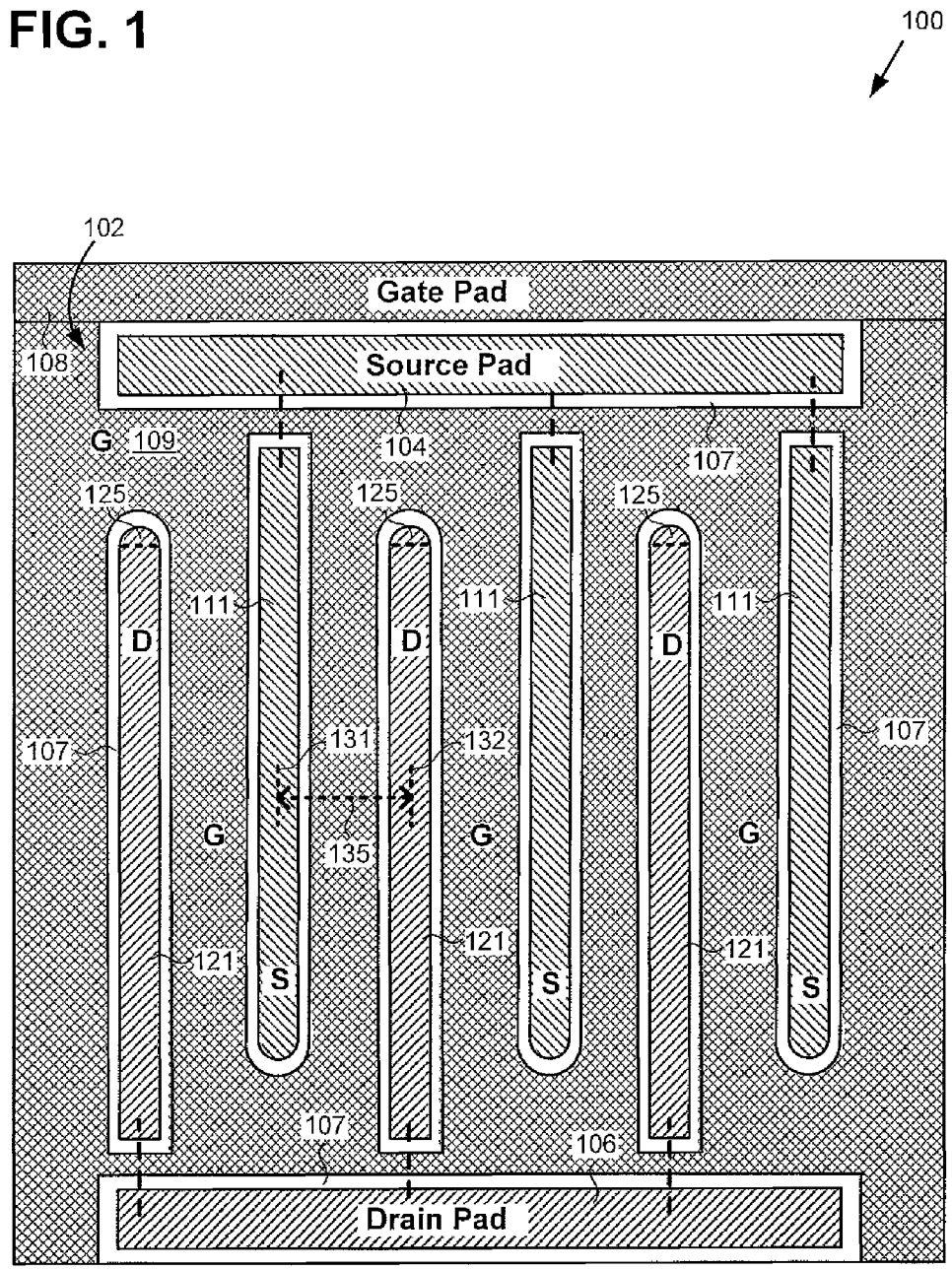
FIG. 1 presents a top plan view of a transistor.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents a top plan view of a transistor. Transistor 100 has active surface 102 including source pad 104, drain pad 106, and gate pad 108. Transistor 100 also includes gate region 109 adjoining gate pad 108, source finger electrodes 111, drain finger electrodes 121, and field dielectric 107 isolating source finger electrodes 111 and drain finger electrodes 121 from gate region 109. Source finger electrodes 111 are electrically coupled to source pad 104, and drain finger electrodes 121 are electrically coupled to drain pad 106. It is noted that drain finger electrodes 121 are terminated adjacent source pad 104 by being simply rounded off to form semicircular drain finger electrode ends 125. It is further noted that the electrical coupling of source finger electrodes 111 and drain finger electrodes 121 to respective source pad 104 and drain pad 106 is shown by dashed lines because those connections may be formed using one or more additional metal layers not shown in FIG. 1.

Source finger electrodes 111 and drain finger electrodes 121 are situated in gate region 109 and are implemented in an interdigitated pattern such that gate region 109 surrounds source finger electrodes 111 and drain finger electrodes 121, and is disposed between the interdigitated source finger electrodes 111 and drain finger electrodes 121. As further shown in FIG. 1, transistor 100 has source-to-drain half-pitch 135, i.e., the distance separating center line 131 of source finger electrode 111 from center line 132 of drain finger electrode 121.

Transistor 100 has an interdigitated layout commonly utilized to implement lateral power transistors. As shown in FIG. 1, source-to-drain half-pitch 135 is substantially constant along the entirety of drain finger electrodes 121. However, due to the high termination electric fields, which may develop under high voltage operation, particularly at semicircular drain finger electrode ends 125, the robustness of transistor 100 may be compromised. As a result, transistor 100 may break down, become unstable, and/or fail catastrophically under high voltage operation. In accordance with an implementation of the present disclosure, various approaches are described, which can be utilized alone or in any combination to ease the high termination electric fields, amongst other advantages.

Figure 2:
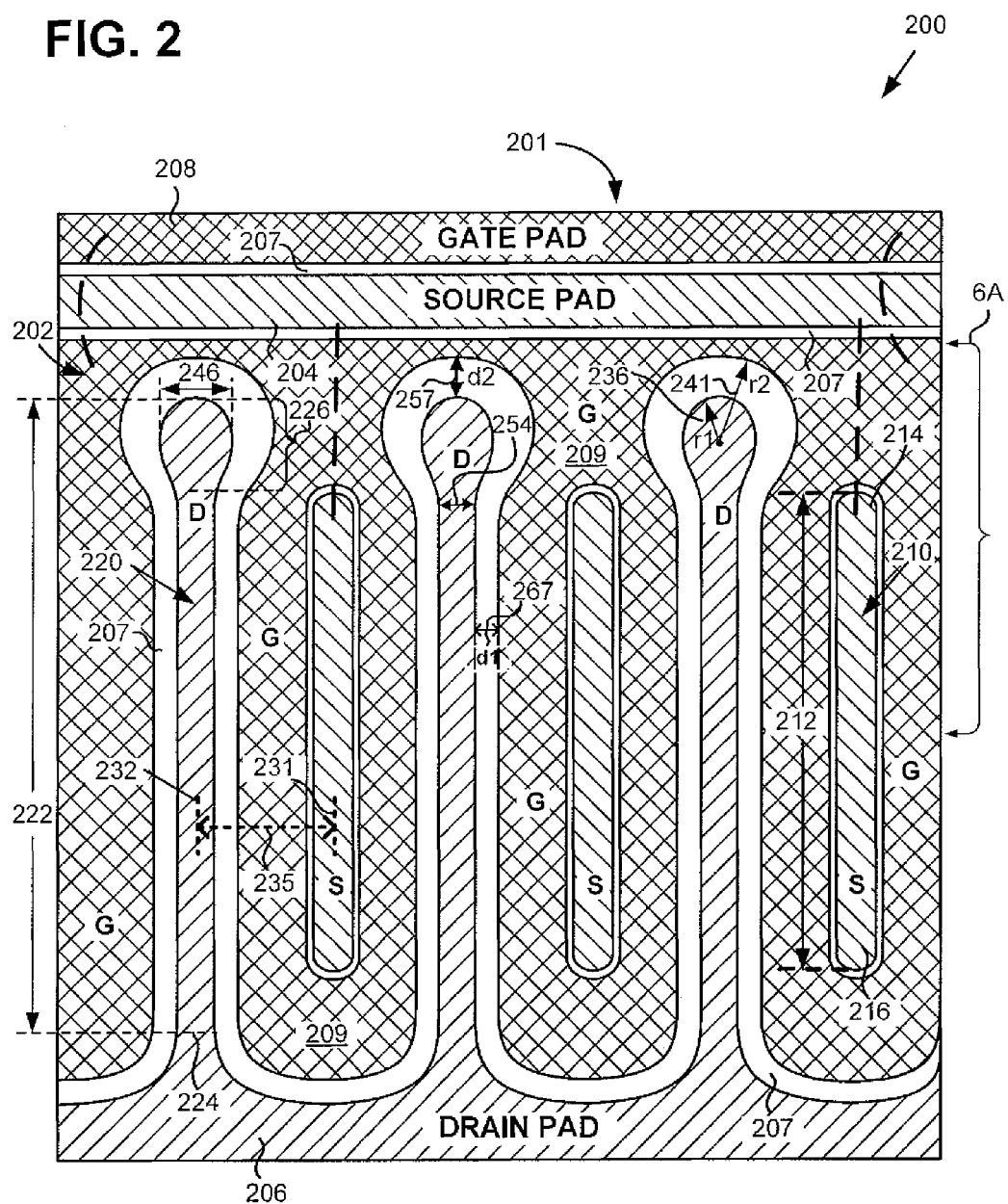
FIG. 2 presents a top plan view of an exemplary transistor having a drain termination enabling increased breakdown voltage, in accordance with an implementation of the present disclosure.

FIG. 2 presents a top plan view of an exemplary transistor having a drain termination enabling increased breakdown voltage, in accordance with an implementation of the present disclosure. FIG. 2 shows transistor 200 fabricated in active surface 202 of semiconductor body 201. Transistor 200 includes drain finger electrodes 220 interdigitated with source finger electrodes 210. Transistor 200 may be a high voltage transistor.

It is noted that as used herein, the feature referred to as a "transistor" may correspond more generally to a variety of specific transistor or other semiconductor device implementations. In one implementation, for example, transistor 200 may take the form of a field-effect transistor (FET). For instance, transistor 200 may be an insulated-gate FET (IGFET) or a heterostructure FET (HFET). In one implementation, transistor 200 may take the form of a metal-insulator-semiconductor FET (MISFET), such as a metal-oxide-semiconductor FET (MOSFET). In other implementations, transistor 200 may take the form of a schottky gated transistor, or a P-N junction gated transistor or (JFET). When implemented as an HFET, transistor 200 may be a high-electron-mobility transistor (HEMT) incorporating a two-dimensional electron gas (2DEG). In yet another implementation, transistor 200 may take the form of a Schottky diode (not shown in FIG. 2), for example through replacement of drain finger electrodes 220 with anode electrodes, replacement of the source finger electrodes 210 with cathode electrodes, and without the controlling gate electrode of FIG. 2.

Referring to the exemplary implementation shown by FIG. 2, semiconductor body 201 of transistor 200 may be configured to provide a group III-V HFET, such as a III-Nitride HEMT. III-Nitride materials include gallium nitride (GaN) and/or its alloys, such as aluminum gallium nitride (AlGaN), indium gallium nitride (InGaN), and aluminum indium gallium nitride (AlInGaN). These materials are semiconductor compounds that have a relatively wide, direct bandgap and strong piezoelectric polarizations, and can enable high breakdown fields, and the creation of 2DEGs. As a result, III-Nitride materials such as GaN are used in many microelectronic applications in which high power density and high efficiency switching are required.

Active surface 202 of transistor 200 includes source pad 204, drain pad 206, and gate pad 208. In addition to drain finger electrodes 220 and source finger electrodes 210, transistor 200 also includes gate region 209, and field dielectric 207. Source finger electrodes 210 are electrically coupled to source pad 204, drain finger electrodes 220 are electrically coupled to drain pad 206, and gate region 209 is electrically coupled to gate pad 208. It is noted that the electrical coupling of source finger electrodes 210 to source pad 204 and that of gate region 209 to gate pad 208 is shown by dashed lines because those connections may be formed using one or more additional metal layers not shown in FIG. 2.

It is noted that in some implementations, either or both of source pad 204 and drain pad 206 may be on the same plane as source finger electrodes 210 and drain finger electrodes 220. However, in other implementations, source pad 204 and/or drain pad 206 may be on a different plane than that occupied by source finger electrodes 210 and/or drain finger electrode 220. For example, source pad 204 and/or drain pad 206 may be formed on a backside of the device or substrate and electrically connected to their respectively corresponding finger electrodes using electrical through-substrate vias. Such transistor designs with ohmic pad (source and/or drain) construction on other planes are described in U.S. Pat. No. 7,233,028, entitled "Gallium Nitride Material Devices and Methods of Forming the Same," and issued on Jun. 19, 2007; and in U.S. Pat. No. 7,915,645, entitled "Monolithic Vertically Integrated Composite Group III-V and Group IV Semiconductor Device and Method for Fabricating Same," and issued on Mar. 29, 2011. The entire disclosures of U.S. Pat. No. 7,233,028 and U.S. Pat. No. 7,915,645 are hereby incorporated fully by reference into the present application.

As shown in FIG. 2, source finger electrodes 210 and drain finger electrodes 220 may be implemented in an interdigitated pattern such that gate region 209 surrounds source finger electrodes 210 and is between interdigitated source finger electrodes 210 and drain finger electrodes 220. Source finger electrodes 210 have length 212, and drain finger electrodes 220 have length 222. Also shown in FIG. 2 is source-to-drain half-pitch 235 of transistor 200, i.e., the distance separating center line 231 of source finger electrode 210 from center line 232 of drain finger electrode 220.

Source finger electrodes 210 have source finger electrode main bodies 214 coupled to source pad 204, and source finger electrode ends 216 adjacent drain pad 206. Drain finger electrodes 220 have drain finger electrode main bodies 224 coupled to drain pad 206, and curved drain finger electrode ends or tips 226 adjacent source pad 204. As shown in FIG. 2, source-to-drain half-pitch 235 of transistor 200 is substantially constant from source finger electrode main bodies 214 to source finger electrode ends 216. As further shown in FIG. 2, curved drain finger electrode ends 226 are modified in order reduce the electric field at the tips of drain finger electrodes 220.

In at least one exemplary implementation, curved drain finger electrode ends 226 have an increased radius of curvature, such as (r1) 236, for example, resulting in increased width 246 of curved drain finger electrode ends 226 relative to width 254 of drain finger electrode 220. It is noted that as used herein, width 254 is defined as the width of drain finger electrode 220 just before the transition to curved drain finger electrode end 226. As also shown in FIG. 2, radius of curvature (r2) 241 of gate region 209 surrounding curved drain finger electrode end 226 is also increased, which increases the gate-to-drain spacing (d2) 257 in the vicinity of curved drain finger electrode ends 226 compared to the gate-to-drain spacing (d1) 267, further reducing the electric field at curved drain finger electrode ends 226. It is noted that for the purposes of the present application, when curved drain finger electrode ends 226 are described as having an increased radius of curvature, that characterization can apply to either one, or both, of (r1) 236 and (r2) 241.

In some implementations, as shown in FIG. 2, increased radius of curvature (r1) 236 of curved drain finger electrode ends 226 may cause curved drain finger electrode ends 226 to have a generally ellipsoidal shape as discussed in more detail in reference to FIGS. 3A, 3B, and 4, below. One advantage of implementing curved drain finger electrode ends 226 as substantial ellipsoids is that such a shape can aid in reducing or relaxing the high termination electrical fields that can otherwise exist at semicircular drain finger electrode ends 125 of transistor 100, shown in FIG. 1. As a result, increased radius of curvature (r1) 236 and/or increased radius of curvature (r2) 241, as well as the subsequent increase in gate-to-drain spacing (d2) 257 at curved drain finger electrode ends 226, reduces the termination electric field at curved drain finger electrode ends 226 so as to achieve an increased breakdown voltage and reliability for transistor 200.

In some implementations, curved drain finger electrode ends 226 are extended beyond source finger electrode main bodies 214 instead of or in addition to providing curved drain finger electrode ends 226 having an increased radius of curvature. As depicted in FIG. 2, curved drain finger electrode ends 226 are situated closer to source pad 204 than source finger electrode main bodies 214. In doing so, drain finger electrodes 220 may be longer than source finger electrodes 210, as shown. Extension of curved drain finger electrode ends 226 beyond source finger electrode main bodies 214 can advantageously achieve an increased breakdown voltage for transistor 200 without increasing source-to-drain half-pitch 235 along length 212 of source finger electrodes 210. Consequently, the exemplary transistor layout shown in FIG. 2 can be implemented so as to allow for a tighter source-to-drain half-pitch while achieving increased breakdown voltage, thereby providing a low ON-resistance and improved robustness for transistor 200, concurrently.

It is noted that although the implementation shown in FIG. 2 depicts drain finger electrodes 220 as having increased radius of curvature (r1) 236, increased radius of curvature (r2) 241, and increased width 246 at curved drain finger electrode ends 226, as well as having curved drain finger electrode ends 226 extending beyond source finger electrode main bodies 214, that representation is merely exemplary. In other implementations, drain finger electrodes 220 may not have all of those characteristics concurrently.

In one implementation, curved drain finger electrode ends 226 may extend beyond source finger electrode main bodies 214 but not have increased radius of curvature (r1) 236, increased radius of curvature (r2) 241, or increased width 246. Alternatively, according to another implementation, curved drain finger electrode ends 226 may have increased radius of curvature (r1) 236, increased width 246, and/or increased radius of curvature (r2) 241, but may not extend beyond source finger electrode main bodies 214. Thus, according to a variety of possible implementations, drain finger electrodes 220 may have length 222 greater than length 212 of source finger electrodes 210, and/or may have curved drain finger electrode ends 226 extending beyond source finger electrode main bodies 214, and/or may have increased radius of curvature (r1) 236, increased width 246, and/or increased radius of curvature (r2) 241 at curved drain finger electrode ends 226.

Some of the features discussed in conjunction with FIG. 2 will now be further described by reference to FIGS. 3A, 3B, and 4. FIGS. 3A, 3B, and 4 present respective top plan views of exemplary drain terminations having a decreased electric field at the ends or tips of the drain finger electrodes. As further described below, such a decreased electric field can result from increasing a radius of curvature of the gate-to-drain spacing between an edge of a curved drain finger electrode end and a boundary of a gate region surrounding the curved drain finger electrode end, thereby allowing for an increased breakdown voltage and a more robust and reliable transistor. It is noted that the exemplary implementations shown in FIGS. 3A, 3B, and 4 corresponding in general to the implementation shown in FIG. 2.

Figure 3A:
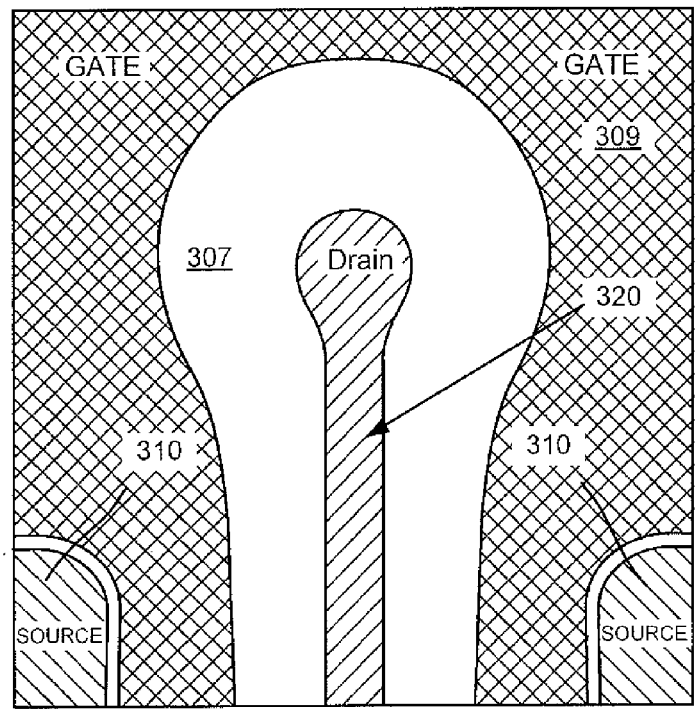
FIG. 3A presents a top plan view of an exemplary drain termination enabling increased breakdown voltage, corresponding in general to the implementation shown in FIG. 2.

FIG. 3A presents a top plan view of an exemplary drain termination enabling increased breakdown voltage, corresponding in general to the implementation shown in FIG. 2. FIG. 3A shows a portion of gate region 309 surrounding drain finger electrode 320. Also shown in FIG. 3A are source finger electrodes 310 with which drain finger electrode 320 is interdigitated, and field dielectric 307. Gate region 309, drain finger electrode 320, source finger electrodes 310, and field dielectric 307 correspond respectively to gate region 209, drain finger electrodes 220, source finger electrodes 210, and field dielectric 207, in FIG. 2.

FIG. 3A shows the relative width of drain finger electrode 320 compared to source finger electrodes 310, as well as the smooth transitions at the curved end of drain finger electrode 320. It is noted that there are no sharp discontinuities in the curvature of the drain finger electrode end. In addition, and as further shown by FIG. 3A, there are no sharp discontinuities at the boundary of field dielectric 307 with gate region 309, which also aids in reducing the electric fields at the end of drain finger electrode 320.

Figure 3B:
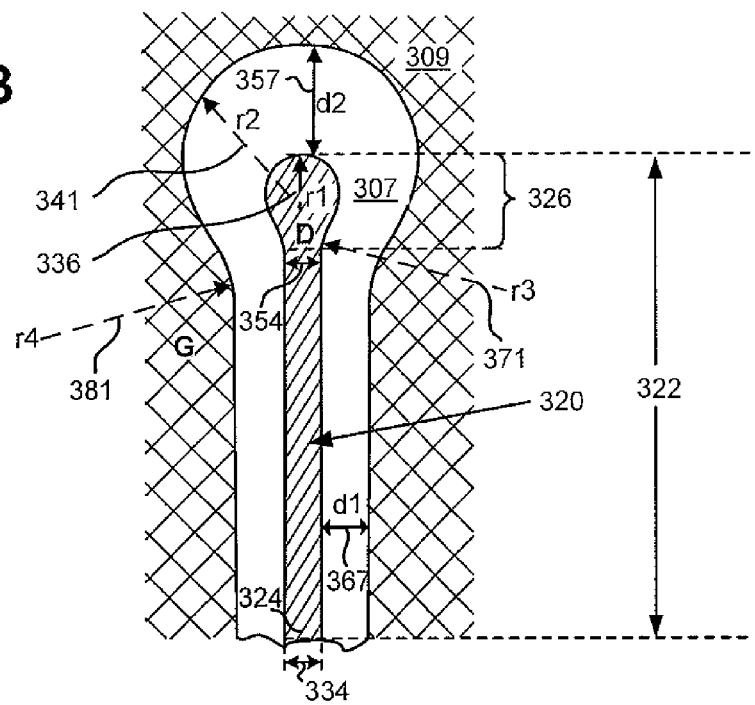
FIG. 3B presents a top plan view of an exemplary drain termination enabling increased breakdown voltage, corresponding in general to the implementation shown in FIG. 2.

Continuing to FIG. 3B, FIG. 3B presents a top plan view of an exemplary drain termination enabling increased breakdown voltage, corresponding in general to the implementation shown in FIG. 2. FIG. 3B shows gate region 309 surrounding drain finger electrode 320. Drain finger electrode 320 has width 354, and also includes drain finger electrode main body 324 having width 334. In addition, FIG. 3B shows curved drain finger electrode end 326 having increased radius of curvature (r1) 336 relative to the radius of curvature of semicircular drain finger electrode ends 125 in transistor 100 of FIG. 1. That is to say, in contrast to transistor 100 having semicircular drain finger ends 125, radius of curvature (r1) 336 of curved drain finger end 326 is greater than a radius of curvature of a circle having a diameter equal to width 354.

Also shown in FIG. 3B is radius of curvature (r2) 341 of the gate electrode region surrounding the drain finger electrode end 326, radius of curvature (r3) 371 of the smooth transition connecting curved drain finger electrode end 326 to drain finger electrode 320, and radius of curvature (r4) 381 of the smooth transition connecting gate region 309 surrounding curved drain finger electrode end 326 to the gate region surrounding drain finger electrode 320. FIG. 3B further depicts gate-to-drain spacing (d1) 367, gate-to-drain spacing (d2) 357, and length 322 of drain finger electrode 320. Gate-to-drain spacing (d1) 367, gate-to-drain spacing (d2) 357, length 322, and width 354, correspond respectively to gate-to-drain spacing (d1) 267, gate-to-drain spacing (d2) 257, length 222, and width 254, in FIG. 2. Moreover, curved drain finger electrode end 326, radius of curvature (r1) 336, and radius of curvature (r2) 341, in FIG. 3B, correspond respectively to curved drain finger electrode ends 226, radius of curvature (r1) 236, and radius of curvature (r2) 241, in FIG. 2.

In certain implementations, r1<r2<r4. Moreover, gate-to-drain spacing (d1) 367 is shown as being less than gate-to-drain spacing (d2) 357. By forming the gate-to-drain spacing such that d1<d2, the reduced electric field at curved drain finger electrode end 326, in combination with the ellipsoidal shape of curved drain finger electrode end 326 and the smooth curvatures created by r1, r2, r3, and r4, allows for the formation of a more robust drain finger electrode termination. It is noted that for the purposes of the present application, when curved drain finger electrode end 326 is described as having an increased radius of curvature, that characterization can apply to any one of (r1) 336, (r2) 341, (r3) 371, or (r4) 381, as well as to any combination of (r1) 336, (r2) 341, (r3) 371, and (r4) 381.

Figure 4:
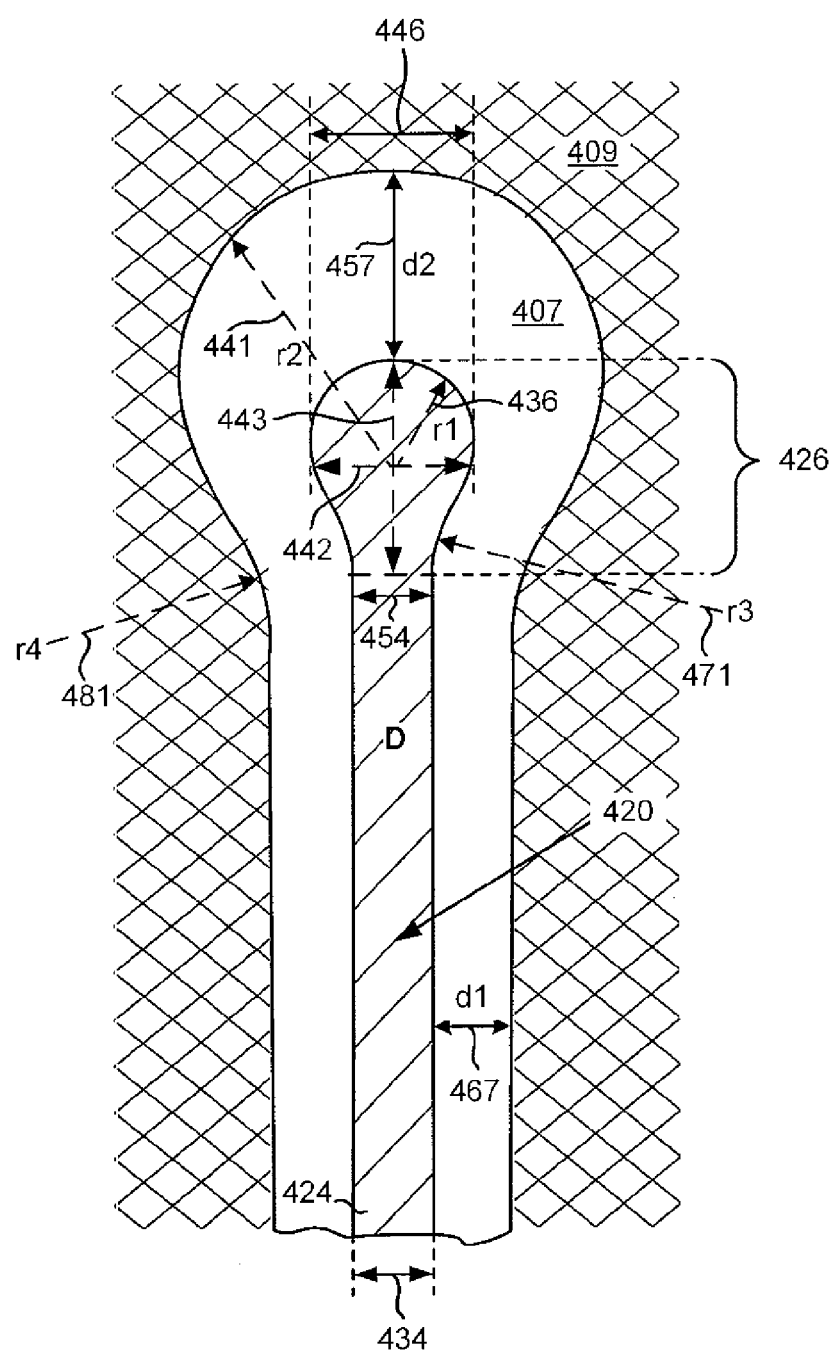
FIG. 4 presents a top plan view of an exemplary drain termination enabling increased breakdown voltage, corresponding in general to the implementation shown in FIG. 2.

Continuing to FIG. 4, FIG. 4 presents a top plan view of an exemplary drain termination enabling increased breakdown voltage, corresponding in general to the implementation shown in FIG. 2. FIG. 4 shows gate region 409 surrounding drain finger electrode 420. Drain finger electrode 420 has width 454 and includes drain finger electrode main body 424 having width 434. In addition, drain finger electrode 420 has curved drain finger electrode end 426 with increased width 446 relative to width 454 of drain finger electrode 420. Also shown in FIG. 4 are field dielectric 407, radius of curvature (r1) 436, radius of curvature (r2) 441, radius of curvature (r3) 471, radius of curvature (r4) 481, gate-to-drain spacing (d1) 467, and gate-to-drain spacing (d2) 457, as well as minor axis 442 and major axis 443 of curved drain finger electrode end 426.

Gate region 409, field dielectric 407, and drain finger electrode 420 correspond respectively to gate region 309, field dielectric 307, and drain finger electrode 320, in FIGS. 3A and 3B. In addition, width 454, curved drain finger electrode end 426, and drain finger electrode main body 424 having width 434, correspond respectively to width 354, curved drain finger electrode end 326, and drain finger electrode main body 324 having width 334, in FIG. 3B. Moreover, gate-to-drain spacings (d1) 467 and (d2) 457, and radii of curvature (r1) 436, (r2) 441, (r3) 471, and (r4) 481, in FIG. 4, correspond respectively to gate-to-drain spacings (d1) 367 and (d2) 357, and radii of curvature (r1) 236, (r2) 241, (r3) 371, and (r4) 381, in FIG. 3B. It is further noted that increased width 446 of curved drain finger electrode end 426, in FIG. 4, corresponds to increased width 246 of curved drain finger electrode end 226, in FIG. 2.

As shown in FIG. 4, curved drain finger electrode end 426 has a shape described by major axis 443 and minor axis 442. Major axis 443 is longer than and substantially perpendicular to minor axis 442. As further shown in FIG. 4, major axis 443 is substantially aligned with drain finger electrode 420, and minor axis 442 is substantially perpendicular to drain finger electrode 420.

In some implementations, for example, curved drain finger electrode end 426 may be substantially an ellipsoid having major axis 443 substantially aligned with drain finger electrode 420. Curved drain finger electrode end 426 taking the form of an ellipsoid with major axis 443 and minor axis 442 results from forming curved drain finger electrode end 426 and the surrounding gate region 409 with increased radii of curvature (r1) 436, r2 (441), r3 (471), and r4 (481) such that r1<r2<r4. In addition, both r3 and r4 radii of curvature are optimized to have a smooth curvature with no sharp discontinuities where they meet drain finger electrode 420 and gate region 409 surrounding drain finger electrode 420, respectively.

Gate-to-drain spacing (d1) 467 is shown as being less than gate-to-drain spacing (d2) 457. As discussed above by reference to FIG. 3B, by forming the gate-to-drain spacing such that d1<d2, in combination with the ellipsoidal shape of curved drain finger electrode end 426, and the smooth curvatures created by radii of curvature r1, r2, r3, and r4, allows for the formation of a more robust drain finger electrode termination.

In some implementations, it may be advantageous for the ratio of increased width 446 to width 454 to be approximately equal to 2:1. In other implementations, it may be advantageous or desirable for the ratio of increased width 446 to width 454 to be greater than 2:1. An advantage of using an ellipsoidal shape for curved drain finger electrode end 426 is that such a shape can aid in minimizing the peak electric fields that can otherwise be present at the transition from a main body to a rounded semicircular end termination region of a conventionally configured drain finger electrode, such as semicircular drain finger electrode ends 125, in FIG. 1.

It is noted that width 454, increased width 446, and curved drain finger electrode end 426 are exaggerated in FIG. 4, for conceptual clarity. Thus, drain finger electrode 420 is not drawn to scale. Nevertheless, drain finger electrode 420 corresponds to drain finger electrodes 220 in FIG. 2, as well as to drain finger electrode 320 in FIGS. 3A and 3B, as noted above.

In some implementations, further improvements in high current carrying transistors can be realized with higher breakdown voltages and lower ON-resistance through use of tapered drain and source finger electrodes, which may be implemented in combination with a curved drain finger electrode end having an increased radius of curvature, corresponding to curved drain finger electrode ends 226/326/426 in respective FIGS. 2, 3B, and 4. Such tapered source and drain finger designs are described in U.S. Pat. No. 7,417,257, entitled "III-Nitride Device with Improved Layout Geometry," and issued on Aug. 26, 2008. The entire disclosure of U.S. Pat. No. 7,417,257 is hereby incorporated fully by reference into the present application.

Figure 5:
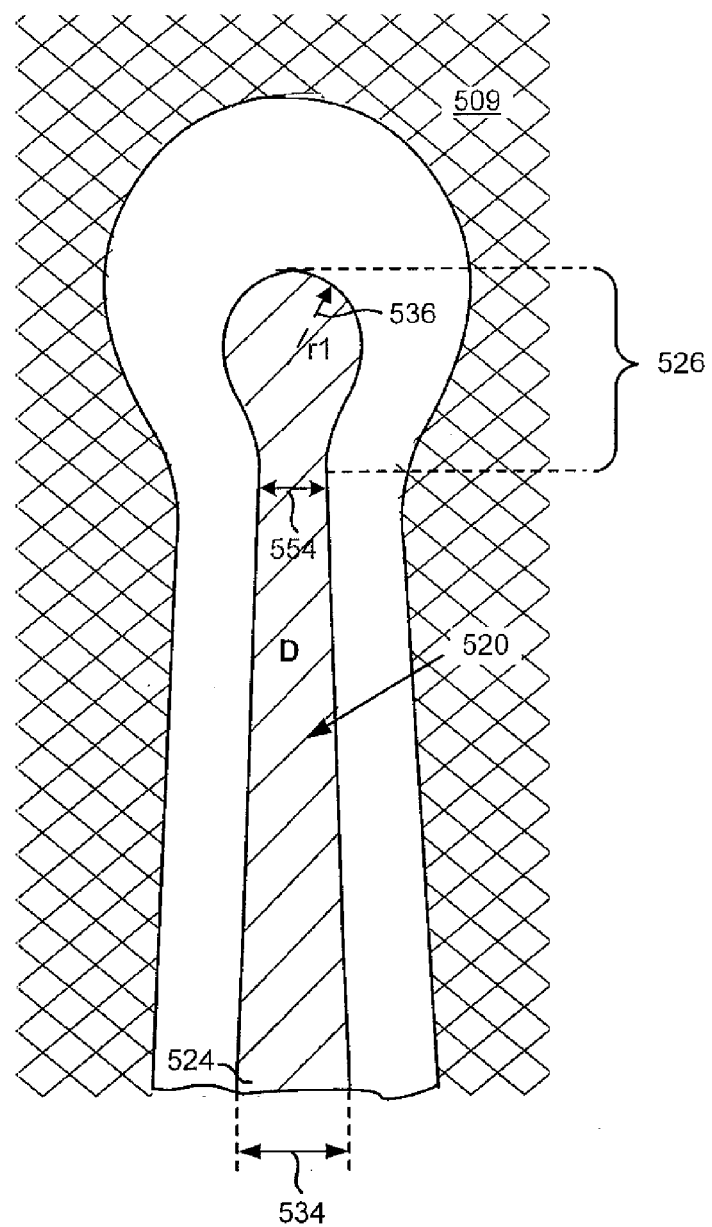
FIG. 5 presents a top plan view of an exemplary drain termination including a tapered drain finger electrode enabling increased breakdown voltage, in accordance with an implementation of the present disclosure.

FIG. 5 presents a top plan view of an exemplary drain termination including a tapered drain finger electrode enabling increased breakdown voltage, in accordance with an implementation of the present disclosure. FIG. 5 shows gate region 509 surrounding tapered drain finger electrode 520. Tapered drain finger electrode 520 has width 554, and includes a tapered drain finger electrode main body 524 having width 534. In addition, tapered drain finger electrode 520 includes curved drain finger electrode end 526 with increased radius of curvature (r1) 536 relative to the radius of curvature of semicircular drain finger electrode ends 125 in transistor 100 of FIG. 1. That is to say, in contrast to transistor 100 having semicircular drain finger ends 125, radius of curvature (r1) 536 of curved drain finger electrode end 526 is greater than a radius of curvature of a circle having a diameter equal to width 554.

As further shown in FIG. 5, width 534 of tapered drain finger electrode main body 524 is larger than width 554. In other words, in contrast to drain finger electrode 320/420 for which width 334/434 of drain finger electrode main bodies 324/424 may be substantially equal to width 354/454, tapered drain finger electrode 520 has a tapered drain finger electrode beginning width 534 that is greater than width 554.

Figure 6A:
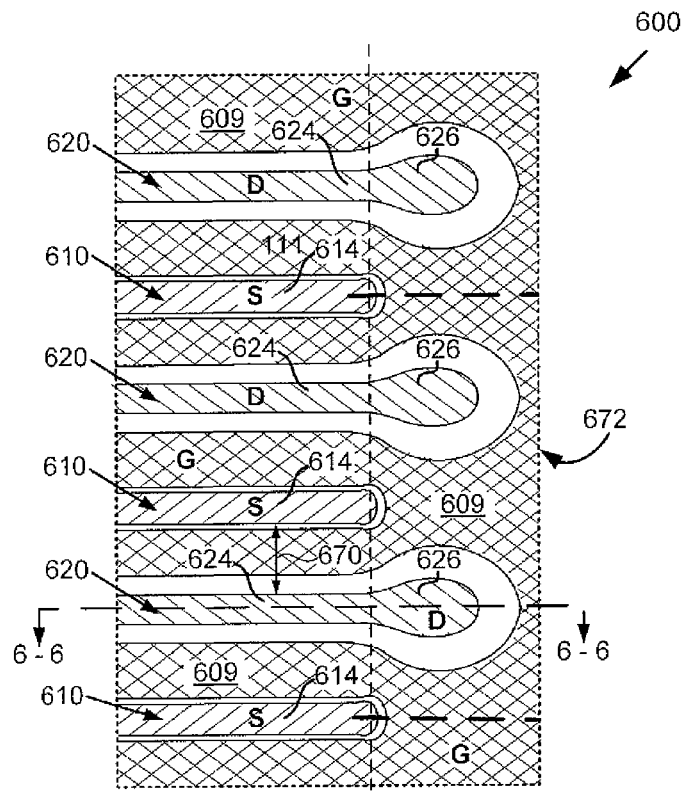
FIG. 6A presents a top plan view of an exemplary transistor having a drain termination enabling increased breakdown voltage, in accordance with an implementation of the present disclosure.
Figure 6B:
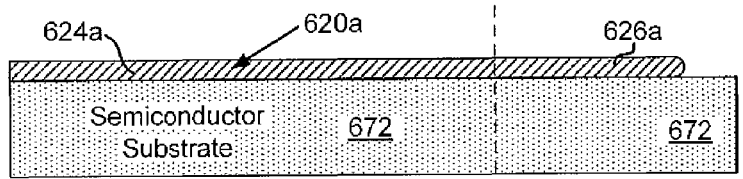
FIG. 6B presents a cross-sectional view of an exemplary transistor, in accordance with an implementation of the present disclosure.
Figure 6C:
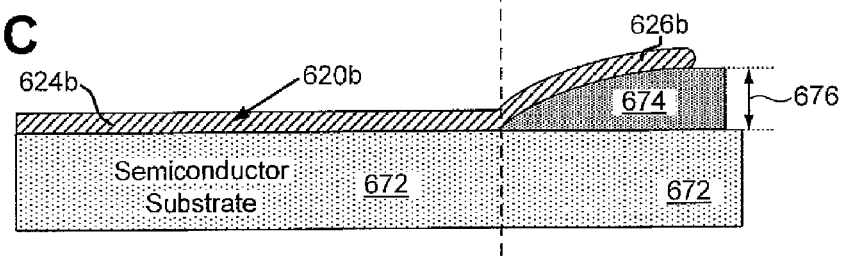
FIG. 6C presents a cross-sectional view of an exemplary transistor having a drain finger electrode main body which is non-coplaner with the drain finger termination, in accordance with an implementation of the present disclosure.

A further approach to minimizing the termination peak electric fields is described below with respect to FIGS. 6A, 6B, and 6C. FIG. 6A presents a top plan view of an exemplary transistor having a drain termination enabling increased breakdown voltage, in accordance with an implementation of the present disclosure. The portion of transistor 600 shown in FIG. 6A can correspond to the portion of transistor 200 labeled with bracket 6A in FIG. 2. FIGS. 6B and 6C present cross-sectional views of exemplary transistors, in accordance with an implementation of the present disclosure. The cross-sectional views in FIGS. 6B and 6C can correspond to cross-section 6-6 in FIG. 6A in different implementations of the present disclosure.

Transistor 600 includes drain finger electrodes 620 and source finger electrode 610 corresponding respectively to drain finger electrodes 220 and source finger electrode 210 in FIG. 2. Transistor 600 also includes gate region 609 corresponding to gate region 209 in FIG. 2.

Similar to transistor 200, drain finger electrodes 620 are interdigitated with source finger electrodes 610. Drain finger electrodes 620 and source finger electrodes 610 are situated in, on, or above (or a combination thereof, i.e., non-coplaner) semiconductor substrate 672. Semiconductor substrate 672 can be, for example, a III-Nitride material stack, such as a HEMT material stack, silicon, and/or other semiconductor material. Current conduction paths, such as current conduction path 670, are in semiconductor substrate 672 between drain finger electrodes 620 and source finger electrodes 610. Gate region 609 is configured to control current conduction in semiconductor substrate 672 through the current conduction paths between drain finger electrodes 620 and source finger electrodes 610.

Also in transistor 600, drain finger electrodes 620 have drain finger electrode main bodies 624 and drain finger electrode ends 626 (e.g. curved drain finger electrode ends 626) corresponding respectively to drain finger electrode main bodies 224 and drain finger electrode ends 226 in FIG. 2. Source finger electrodes 610 have source finger electrode main bodies 614 and source finger electrode ends (not shown in FIG. 6A) corresponding respectively to source finger electrode main bodies 214 and source finger electrode ends 216 in FIG. 2. In some implementations, drain finger electrode main bodies 624 are coplanar with drain finger electrode ends 626 as described by FIG. 6B. In other implementations, drain finger electrode main body 624 is non-coplanar with at least a portion of drain finger electrode end 626 as described by FIG. 6C.

Referring to FIG. 6B, drain finger electrode 620a is shown having drain finger electrode main body 624a and drain finger electrode end 626a. Drain finger electrode 620a is situated on semiconductor substrate 672. In particular, drain finger electrode main body 624a and drain finger electrode end 626a are both situated on semiconductor substrate 672 and are coplanar. Any or all of drain fingers electrodes 620 in transistor 600 can have a similar cross-section as shown in FIG. 6B. However, by configuring any or all of drain fingers electrodes 620 in accordance with the implementation shown in FIG. 6C, termination electric fields, which may develop during operation, particularly at drain finger electrode ends 626, can be further eased.

Referring now to FIG. 6C, drain finger electrode 620b is shown having drain finger electrode main body 624b and drain finger electrode end 626b. Drain finger electrode 620b is situated on semiconductor substrate 672. In particular, drain finger electrode main body 624b is situated on semiconductor substrate 672. However, dielectric material 674 is situated between at least portion of drain finger electrode end 626b and semiconductor substrate 672. Drain finger electrode end 626b is formed over dielectric material 674 and over semiconductor substrate 672 such that at least a portion of drain finger electrode end 626b is non-coplanar with drain finger electrode main body 624b. Furthermore, dielectric material 674 insulates drain finger electrode end 626b from semiconductor substrate 672 thereby further easing termination electric fields, which may develop at drain finger electrode end 626b. Thus, transistor 600 can have an even higher breakdown voltage and a lower on-resistance when using the drain finger termination topology shown in FIG. 6C.

Examples of dielectric material 674 include one or more dielectrics, such as any combination of silicon nitride, silicon oxide, oxynitride, or other insulating material. In certain implementations, dielectric material 674 includes tetraethyl orthosilicate (TEOS). The dielectrics may be provided in layers, such as in a dielectric stack, or may be provided by a combination of similar or dissimilar materials.

In some implementations, dielectric material 674 is of a substantially uniform thickness. However, in the implementation shown in FIG. 6C, dielectric material 674 is an increasing thickness dielectric material. By configuring the thickness of dielectric material 674, the easing of the termination electric fields can be controlled, for example, by gradually increasing the insulation thickness along the length of drain finger electrode end 626b between drain finger electrode end 626b and semiconductor substrate 672.

Dielectric material 674 may be situated at least partially in semiconductor substrate 672. For example, dielectric material 674 may be situated in a trench in semiconductor substrate 672. However, in the present implementation, dielectric material 674 is situated on and over semiconductor substrate 672. In doing so, drain finger electrode end 626b has increased elevation 676 and is non-coplanar relative to drain finger electrode main body 624b. Increased elevation 676 increases with the increasing thickness of dielectric material 674.

Thus, FIGS. 6A and 6B present another approach, which can be utilized to enhance performance of a semiconductor device, such as a transistor or a diode. As such, this approach may be applied to a device such as transistor 100 in FIG. 1 without utilizing other approaches described herein. Alternatively, any the aforementioned approaches can be employed. For example, as shown in FIG. 6A, any of drain finger electrodes ends 626 can have an increased radius of curvature. Furthermore, any of drain finger electrode ends 626 can extend beyond any of source finger electrode main bodies 614, as shown. Also, any of drain finger electrode ends 626 can be a tapered drain finger electrode (not shown in FIG. 6A).

In accordance with various implementations disclosed by the present application, termination electric fields at drain finger electrode ends can be reduced. As a result, disclosed implementations achieve an increased breakdown voltage. The implementations disclosed herein can achieve the increased breakdown voltage while concurrently maintaining a low specific ON-resistance (on-resistance in the active area) through a shorter source-to-drain half pitch.

From the above description it is manifested that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A transistor comprising:
   drain finger electrodes and source finger electrodes situated on a semiconductor substrate, said drain finger electrodes coupled to a drain pad, said source finger electrodes coupled to a source pad;
   said drain finger electrodes interdigitated with said source finger electrodes, said drain finger electrodes extending beyond said source finger electrodes so as to be situated closer to said source pad than said source finger electrodes;
   a gate region configured to control current conduction in said semiconductor substrate between said drain finger electrodes and said source finger electrodes;
   at least one of said drain finger electrodes having a drain finger electrode main body and a drain finger electrode end having an increased elevation relative to said drain finger electrode main body;
   wherein a dielectric material insulates said drain finger electrode end from said semiconductor substrate.

2. The transistor of claim 1, wherein said dielectric material provides said increased elevation of said drain finger electrode end relative to said drain finger electrode main body.

3. The transistor of claim 1, wherein said drain finger electrode end has an increased radius of curvature.

4. The transistor of claim 1, wherein at least one of said source finger electrodes has a source finger electrode main body coupled to a source pad, said drain finger electrode end extending beyond said source finger electrode main body.

5. The transistor of claim 1, wherein said drain finger electrodes are longer than said source finger electrodes.

6. The transistor of claim 1, wherein said drain finger electrode end has an increased width relative to a width of said drain finger electrode main body.

7. The transistor of claim 1, wherein said drain finger electrode main body is situated on said semiconductor substrate.

8. The transistor of claim 1, wherein said transistor is a high-electron-mobility transistor (HEMT).

9. The transistor of claim 1, wherein said transistor comprises a group III-V transistor.

10. The transistor of claim 1, wherein said drain finger electrode end is substantially an ellipsoid.

11. The transistor of claim 1, wherein said drain finger electrode is a tapered drain finger electrode.

\* \* \* \* \*